Dec. 2, 1958 J. H. DOYLE 2,863,125

COUPLING CIRCUITS OR THE LIKE

Filed Dec. 20, 1954

JAMES H. DOYLE
*INVENTOR.*

BY [signature]

HIS ATTORNEY

United States Patent Office 2,863,125

Patented Dec. 2, 1958

2,863,125

COUPLING CIRCUITS OR THE LIKE

James H. Doyle, Inglewood, Calif., assignor to Hoffman Electronics Corporation, a corporation of California Application December 20, 1954, Serial No. 476,335

4 Claims. (Cl. 333—12)

This invention is related to high-Q parallel resonant coupling circuits, and more particularly, to an improved coupling circuit which will reduce the ring-time effects of impulse noise having greater than a predetermined amplitude.

In the past, noise reduction circuits have employed, in the main, either progressive limiting, 180° phase-shaft noise cancellation, or perhaps both. Present-day designs of suitable noise reduction circuits often require the employment of comparatively extensive circuitry. The present invention, however, is of extremely simple design and is directed to noise reduction in the parallel resonant coupling circuits of, for example, the I.-F. stages of a conventional superheterodyne receiver, the object in view being to reduce the ring-time of noise above the signal level in these coupling circuits. Several embodiments of this invention are also suited to television and radar techniques in which it is desired to preserve the narrow pulse width of narrow pulses passing through coupling circuits.

Therefore, it is an object of the present invention to provide a new and useful coupling circuit.

It is an additional object of the present invention to provide a new and useful coupling circuit which will exhibit a high Q, or factor of merit, and also decrease to a minimum the ring-time of impulse noise above a chosen reference level.

It is a still further object of the present invention to provide a new and useful coupling circuit which will maintain the narrow width of narrow input signal pulses.

According to the present invention, two parallel resonant circuits are intercoupled by a unidirectional device, such as a diode, and also by a source of D.-C. bias potential. Impulse noise having energies above a chosen level, as determined by the magnitude of the voltage from the aforementioned D.-C. source, are translated from the primary parallel resonant circuit through the aforementioned diode to the second parallel resonant circuit to be dissipated therein. The reverse resistance of the diode taken in combination with the chosen D.-C. voltage magnitude serves to impede the re-transfer of noise energy to the primary parallel resonant circuit. It is interesting to note in passing that the higher the Q of the primary parallel resonant circuit, the better is the operation of this invention, by virtue of the reduced ring-time of above-threshold impulse noise.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
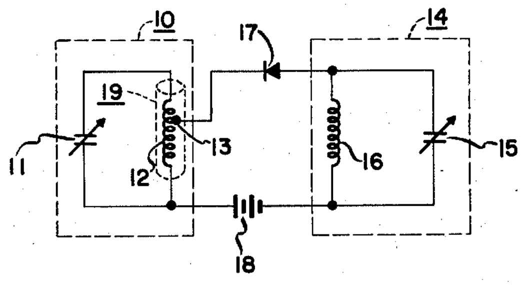
Figure 1 is a schematic diagram of a coupling circuit forming the basis of the present invention.

In Figure 1, parallel resonant circuit 10 consists of variable capacitor 11 and inductor 12 having tap 13. Parallel resonant circuit 14 consists of variable capacitor 15 and inductor 16. Diode 17 intercouples one terminal of inductor 16 and tap 13 of inductor 12. D.-C. voltage source 18 intercouples the remaining end-terminal of inductor 16 with an end-terminal of inductor 12, as shown. Circuits 10 and 14 are each tuned to be resonant at substantially the same frequency.

The circuit of Figure 1 constitutes the basic circuit of this invention and operates as follows. The D.-C. voltage magnitude of source 18 is chosen so that, for a given input signal level, the algebraic sum of the instantaneous voltage across parallel resonant circuit 14 and the D.-C. voltage exhibited by source 18 will always be less than the contact potential of diode 17. Thus, signals having energy levels below this "threshold" will not be translated through diode 17 to parallel resonant circuit 10 and, accordingly, the circuit of Figure 1 will perform as though parallel resonant circuit 10, diode 17 and D.-C. voltage source 18 were not present. However, upon the occurrence of a noise impulse of positive polarity across parallel resonant circuit 14, the energy level of which exceeds the threshold as determined by source 18, the "above-threshold" noise energy will be translated through diode 17 to parallel resonant circuit 10. The ring-time of the noise energy in circuit 10 will of course be directly proportional to the Q of circuit 10. This ringing in parallel resonant circuit 10 serves to dissipate the noise energy by reason of circuit resistance and, if inductor 12 is properly shielded (as is indicated by shield 19 in Figure 1), such ringing will not affect adjacent circuit components. Leads between capacitor 11 and inductor 12 should, of course, be made as short as possible. Tap 13 should be positioned on inductor 12 so as to prevent a re-transfer of noise energy to parallel resonant circuit 14 during the negative half-cycles of noise ringing in parallel resonant circuit 10. The appropriate positioning of tap 13 will of course be dictated by the circuit parameters such as the turns-ratio of inductors 12 and 16, and so forth.

It becomes apparent then that the basic principle of this invention is that of transferring noise energy above a certain threshold level through an electronic switch (such as a diode) to an associated parallel resonant circuit in which noise-ringing is unobjectionable. It is to be observed that the higher the Q, or factor of merit, of parallel resonant circuit 14, the better is circuit operation. In practice, the Q of parallel resonant circuit 10 will be sufficiently high so as to insure an optimum energy transfer from parallel resonant circuit 14. Remarkable results have been obtained through the use of the circuit shown in Figure 1 in experiments which have been conducted. The persistence of a noise impulse in parallel resonant circuit 14 will under optimum conditions be one and one-half cycles. Hence, by the present invention, coupling circuits of relatively simple design can be extremely selective and yet preclude the undesirable ringing of impulse noise for more than one and one-half cycles or less. Such a circuit is ideally suited to television and radar applications in which it is desirable to preserve narrow pulse widths, i. e., by precluding "trailing-off" effects.

Figure 2:
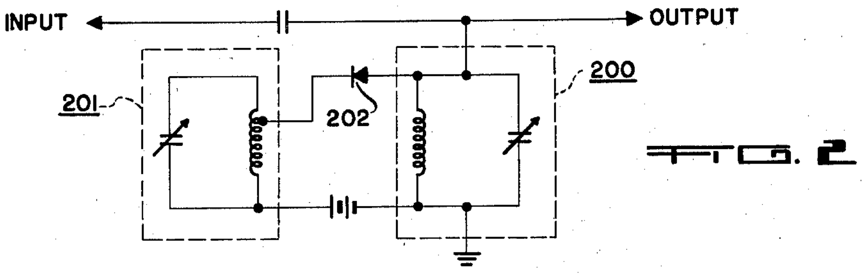
Figure 2 is a schematic diagram of a first embodiment of the present invention.

In Figure 2, input and output circuits are coupled across parallel resonant circuit 200. The operation of this circuit shown in Figure 2 is precisely the same as that of Figure 1. It is to be noted that parallel resonant circuit 201 serves merely to dissipate noise energy as is translated from parallel circuit 200 through diode 202.

Figure 3:
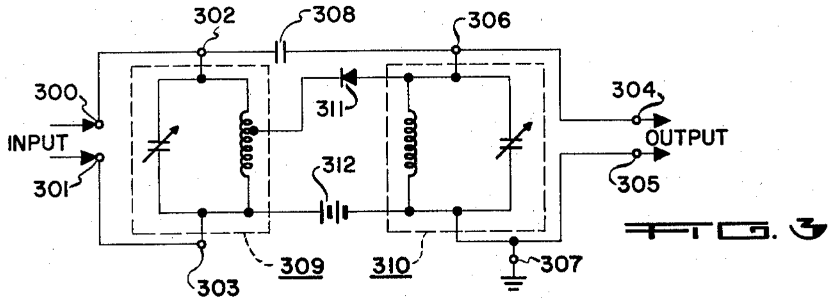
Figure 3 is a schematic diagram of a second embodiment of the present invention.

The basic circuit of Figure 1 is again shown in the embodiment of Figure 3, in which input terminals 300 and 301 are coupled to terminals 302 and 303, respectively, output terminals 304 and 305 are coupled to terminals 306 and 307, respectively, and capacitor 308 intercouples terminals 302 and 306.

The circuit shown in Figure 3 operates as follows. Parallel resonant circuit 309 serves not only as a dummy load to dissipate noise energy but also as a parallel resonant circuit the energy from which is coupled through capacitor 308 to parallel resonant circuit 310. It is to be noted that even though parallel resonant circuit 309 is noise-ringing and in addition is an integral part of the coupling circuit, yet little noise will appear in parallel resonant circuit 310, owing to the operation of diode 311 and D.-C. voltage source 312, as hereinbefore explained.

Figure 4:
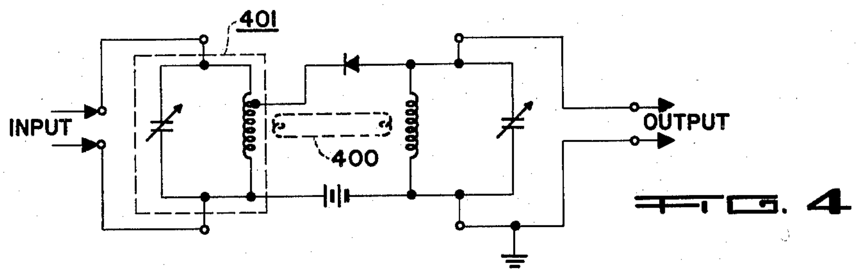
Figure 4 is a schematic diagram of a third embodiment of the present invention.

Figure 4 depicts a circuit identical to that of Figure 3, with the exception that capacitor 308 of Figure 3 is deleted and is replaced by inductive coupling 400; thus, the fact is illustrated that whether inductive coupling or capacitive coupling is used, parallel resonant circuit 401 may constitute an integral part of the coupling circuit and not serve merely as a dummy load to dissipate noise energy. It has appeared experimentally that for optimum results parallel resonant circuit 309 (in Figure 3) and parallel resonant circuit 401 (in Figure 4) should be tuned slightly off frequency.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A coupling circuit including, in combination, first and second parallel resonant circuits having a first and a second inductor, respectively, and being resonant at substantially the same frequency, first and second terminals having at least a portion of said first inductor therebetween, third and fourth terminals having at least a portion of said second inductor therebetween, said first and second terminals exhibiting less inductance therebetween than the inductance exhibited between said third and fourth terminals, a diode coupling together said first and third terminals, and a D.-C. voltage source coupling together said second and fourth terminals and being poled to bias said diode against conduction in the absence of an instantaneous voltage between said third and fourth terminals of opposite polarity and greater magnitude than the instantaneous voltage across the series combination of said D.-C. voltage source and said inductance between said first and second terminals.

2. Apparatus according to claim 1 in which input terminals are connected to said first parallel resonant circuit, output terminals are connected to said second parallel resonant circuit, and a coupling capacitor intercouples one of said input terminals with one of said output terminals.

3. Apparatus according to claim 1 in which both input and output terminals are connected to said second parallel resonant circuit only.

4. Apparatus according to claim 1 in which input terminals are connected to said first parallel resonant circuit only, output terminals are connected to said second parallel resonant circuit only, and said first and second parallel resonant circuits are inductively intercoupled.

References Cited in the file of this patent

UNITED STATES PATENTS

| | | |
|---|---|---|
| 1,746,305 | Espenschied | Feb. 11, 1930 |
| 2,253,531 | Peters et al. | Aug. 26, 1941 |
| 2,405,616 | Silver | Aug. 13, 1946 |
| 2,735,902 | Vose | Feb. 21, 1956 |

OTHER REFERENCES

Bacon: QST, October 1939, pp. 15–17 (copies in Scientific Library and Div. 51).

Olson: Electronics, December 1947, pp. 118–122 (copies in Scientific Library and Div. 69).